(12) United States Patent
Farole et al.

(10) Patent No.: US 7,481,671 B1
(45) Date of Patent: Jan. 27, 2009

(54) MECHANICALLY INTERCONNECTED FOIL CONTACT ARRAY HAVING L-SHAPED CONTACTS AND METHOD OF MAKING

(75) Inventors: Dominic Anthony Farole, Hummelstown, PA (US); Keith Edwin Miller, Manheim, PA (US)

(73) Assignee: Tyco Electronics Coporation, Middletown, PA (US)

( * ) Notice: Subject to any disclaimer, the term of this patent is extended or adjusted under 35 U.S.C. 154(b) by 0 days.

(21) Appl. No.: 11/934,276

(22) Filed: Nov. 2, 2007

Related U.S. Application Data

(60) Provisional application No. 60/864,804, filed on Nov. 8, 2006.

(51) Int. Cl.
*H01R 31/08* (2006.01)
(52) U.S. Cl. ...................................... 439/507
(58) Field of Classification Search ............. 439/511, 439/502, 65, 507; 361/782
See application file for complete search history.

(56) References Cited

U.S. PATENT DOCUMENTS

| | | | | |
|---|---|---|---|---|
| 4,345,301 A | * | 8/1982 | Nelson | 361/782 |
| 4,357,750 A | * | 11/1982 | Ostman | 29/847 |
| 5,387,111 A | * | 2/1995 | DeSantis et al. | 439/65 |
| 2005/0268911 A1 | | 12/2005 | Cross et al. | |

\* cited by examiner

*Primary Examiner*—Phuong K Dinh

(57) ABSTRACT

An array of thin metallic foil strips of predetermined thickness electrically connected to a printed circuit board, cables or attached to wires. An associated power source, on the printed circuit board, or attached to the circuit board, cables or wires, directs an electrical current through L-shaped contacts to one or more of the strips in the array of foil strips. The foil strips are in contact with horizontal legs of the L-shaped contacts. Depending upon the use of the circuit board, the foil strips can be used to start or to end an operation. The selection of the foil strip makes use of the electrical properties of the selected metal such as its resistivity as well as the thickness, length and width of the foil strips to provide a strip with characteristics required to achieve a preselected result. As an electric current is provided by a power source, it passes through one or more foil strips. The application of current through the metallic material can be used to achieve a number of results, such as to act as a heating element.

15 Claims, 5 Drawing Sheets

MECHANICALLY INTERCONNECTED FOIL CONTACT ARRAY HAVING L-SHAPED CONTACTS AND METHOD OF MAKING

This application claims the benefit of the filing date of Provisional Application 60/864,804 entitled MECHANICALLY INTERCONNECTED FOIL CONTACT ARRAY HAVING L-SHAPED CONTACTS AND METHOD OF MAKING filed on Nov. 8, 2006.

FIELD OF THE INVENTION

The present invention is directed to an ultra-thin flexible circuit and specifically to the use of the ultra-thin flexible circuit to control an operation.

BACKGROUND OF THE INVENTION

Microchip devices have been used for a wide variety of applications. However, these devices have not included ultra-thin metal foils. Simple problems faced in utilizing these ultra-thin foils in microchip devices include handling the foils, as they are susceptible to tearing. More complex problems include assembling the foils to other components of the microchip devices. These methods are required to establish good mechanical contact between the foil and the associated devices, as well as applying normal forces to the foil without damaging it so as to retain it in position once mechanical contact is established. Since the ultra-thin metal foils in microchip devices will carry electrical current, it is also difficult and necessary to clean the surface of the foils of oxides without damaging, tearing or puncturing the foil.

Before ultra-thin metal foils can be used as production items for microchips, solutions to these problems must be found. Uses for such ultra-thin foils in microchips are limited because of these problems, but will expand once solutions to these problems are presented.

SUMMARY OF THE INVENTION

The present invention is an array of metallic foil strips of predetermined thickness electrically connected to a printed circuit board, cables or attached to wires. An associated power source, on the printed circuit board, or attached to the circuit board, cables or wires, directs an electrical current through one or more preselected strips in the array of foil strips. Depending upon the use of the circuit board, the foil strips can be used to start or to end an operation.

The selection of the foil strip makes use of the electrical properties of the metal such as its resistivity as well as the thickness and width of the foil strips to provide a strip with characteristics required to achieve a preselected result. As an electric current is provided by a power source, it passes through L-shaped contacts mechanically connected, and therefore electrically connected, to the one or more foil strips. The L-shaped contacts are inserted into a housing and the foil strip is captured between the L-shaped contacts and a beam that is ultrasonically welded to the L-shaped housing. The application of current through the metallic material can be used to achieve a number of results. For example, the current can cause the temperature of one or more foil strips to increase, due to the resistivity of the selected metal, causing the foil to act as a heating element.

There are a number of factors that can be varied to achieve a preselected foil temperature. Certainly, one of the factors is the resistivity of the metallic material selected as part of the foil selection process. The thickness of the foil as well as the width of the metallic material in a strip can also affect the foil temperature. Of course, the current supplied also affects the foil temperature. Thus, by careful selection of the metallic material, foil thickness, foil width and foil length and current supplied, the effective temperature of the foil, and a control device, which may conveniently be included on a printed circuit board, the metal foil an be used as a variable heating element to carefully control the temperature within a confined space.

An advantage of the present invention is that the printed circuit board can be used multiple times before replacement by providing the printed circuit board with logic to apply the current to different elements in the array of foil strip elements sequentially or in seriatim.

Another advantage of the present invention is that the foil can be used as a coated substrate, the substrate being protected from exposure to an environment until a predetermined temperature is achieved, thereby liberating a coating material on the substrate and exposing the substrate.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Figure 1:
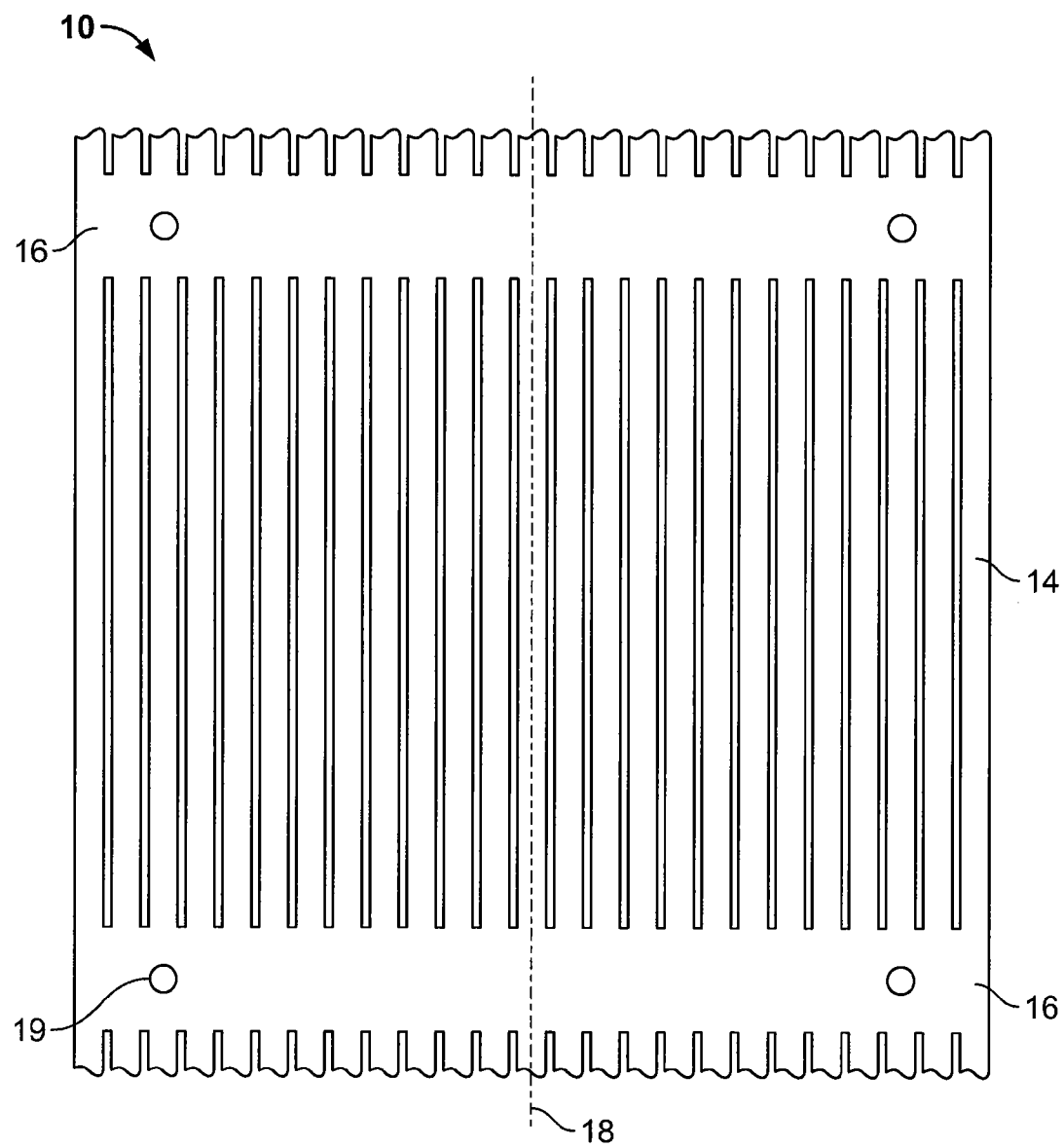
FIG. 1 is a perspective view of a foil array of the present invention.
Figure 2:
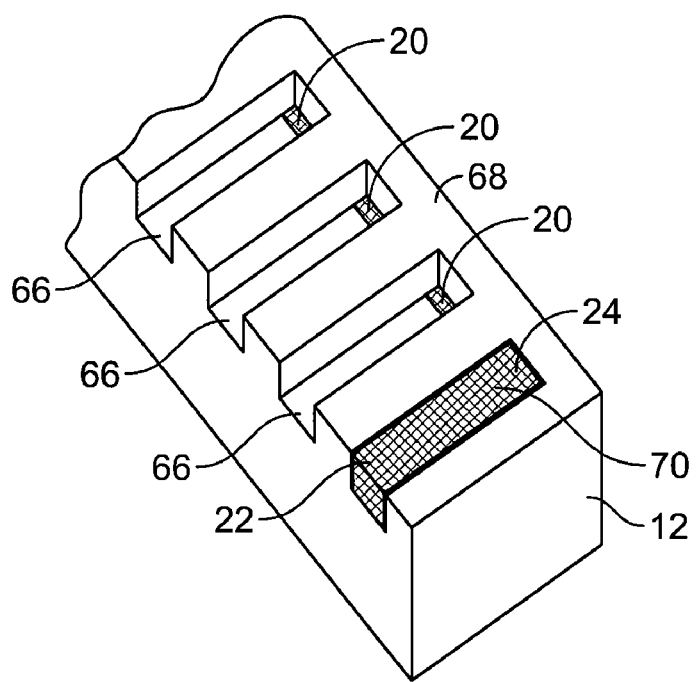
FIG. 2 is a partial view of the housing having pockets, an L-shaped contact assembled into one of the pockets in accordance with the present invention.
Figure 3:
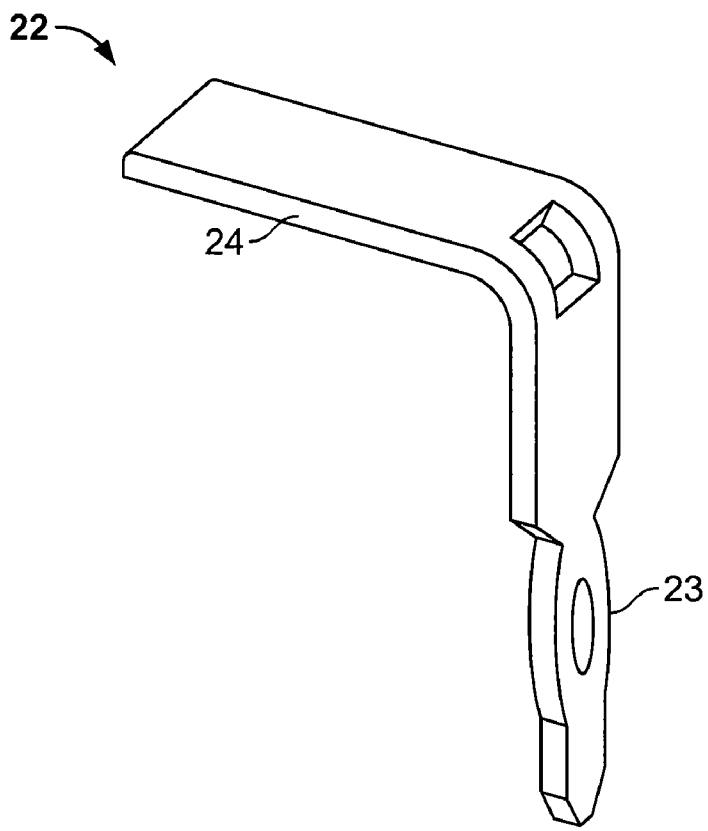
FIG. 3 depicts an L-shaped contact of the present invention.

The present invention provides an ultra-thin metallic foil as an array of strips electrically connected to a power supply that provides an electrical current through the metallic foil. As used herein, an ultra-thin metallic foil means a metallic foil having a thickness of 0.005 inches and thinner. Preferably, the ultra-thin metallic foil is connected to a printed circuit board (PCB) that either includes the power supply or is connected to the power supply. Preferably the foil connections are mechanical in nature, although the foil also can function when connected metallurgically, such as by soldering. A foil array 10 is depicted in FIG. 1. An enlarged view of a portion of housing 12 with an inserted L-shaped contact 22 is shown in FIG. 2. Housing includes a plurality of apertures 20 and a plurality of pockets 66. An L-shaped contact 22 having a horizontal leg 24 is assembled into the pocket 66. FIG. 3 depicts the L-shaped contact 22 having a vertical leg 23 and a horizontal leg 24. The vertical leg 23 of each contact 22 is assembled into an aperture 20 of the housing so that the vertical leg 23 extends from the bottom of the housing, shown in FIG. 4, while the horizontal leg 24 of each L-shaped contact 22 is assembled into one of the pockets 66 formed in a top surface 68 of the housing, so that the horizontal leg 24 of the contact 22 seats in the pocket 66. A top surface 70 of the horizontal leg 24 assembled in the pocket 66 is either flush with or sits just below the top surface 68 of the housing 12. Depending on the foil array 10 that includes strips 14, it is not necessary that a contact 22 be assembled into every aperture 20. However, in order to complete a circuit, it is necessary for a contact to be assembled onto corresponding apertures on opposed sides 13, 15 of housing 12.

Figure 4:
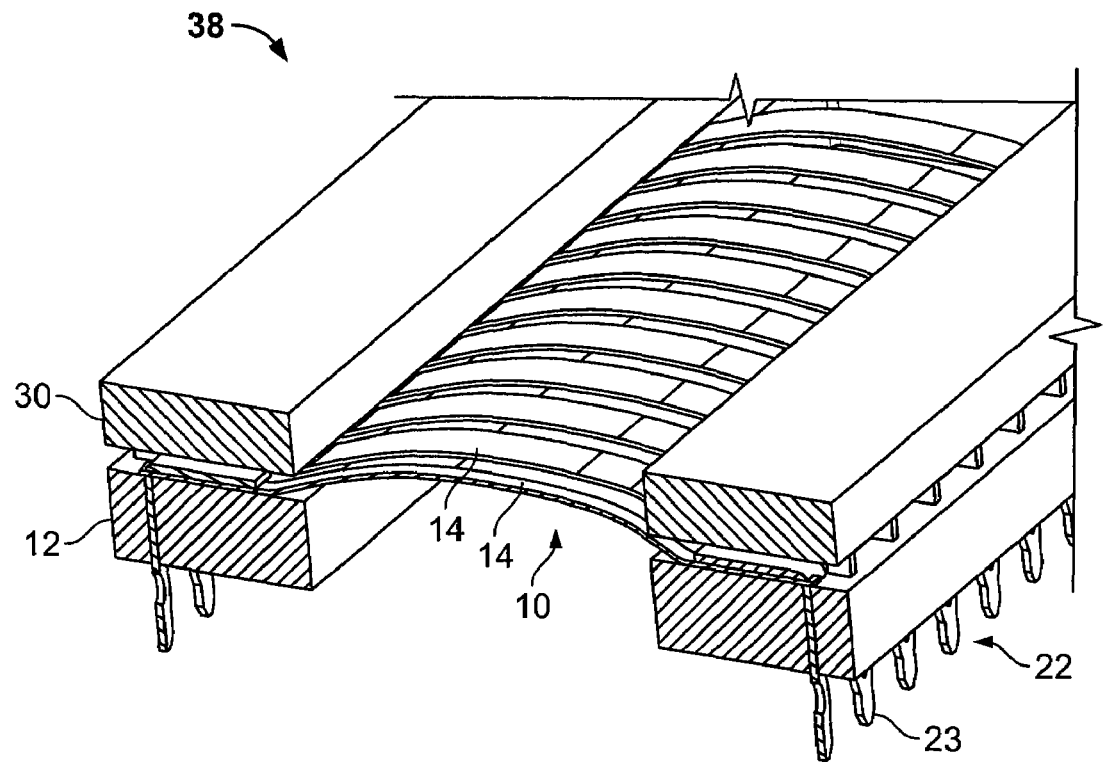
FIG. 4 is a partial schematic of the foil assembled to the housing to form an assembly in accordance with the present invention.

FIG. 4 depicts the assembly comprising housing 12, a plurality of L-shaped contacts 22 assembled to the housing 12 so that the vertical legs 23 of the L-shaped contacts 22 extend from the bottom of housing 12, foil array 10 comprising a plurality of strips 14 assembled over the contacts 22 so that the strips are in contact with the horizontal legs 24 of the contacts and captured between the legs 24 and beam 30, one beam 30 assembled to the opposed sides 13, 15 of the housing.

Figure 5:
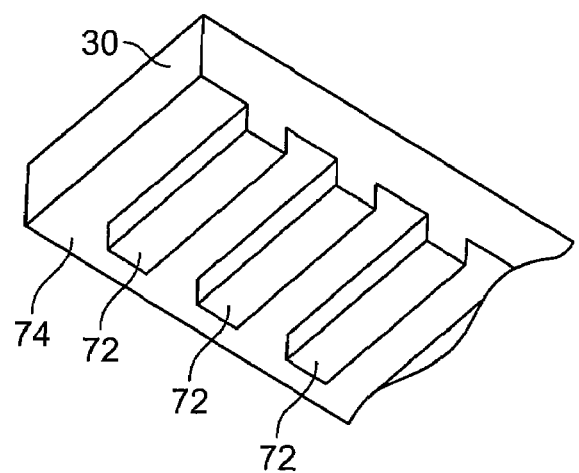
FIG. 5 is a perspective view of one embodiment of a beam of the present invention.

Referring again to FIG. 3, each contact 22 includes a vertical leg 23 and a horizontal leg 24, the vertical leg 23 being assembled into aperture 20 of housing 12. In order to facilitate the assembly of foil array 10 comprising a plurality of strips 14 over the horizontal leg 24, housing 12 includes guides to assist in guiding the thin strips over the horizontal legs of aperture 20. The guide feature can take many forms. Simply designing the housing and the L-shaped contacts so that the top surface 70 of the horizontal legs of the contacts are below the housing top surface allows the housing pocket above the legs to act as a guide. In this circumstance, beam 30 can be designed as shown in the partial cross section in FIG. 5. Beam 30 includes a plurality of ribs 72 projecting downward from a bottom surface 74 of the beam. The bottom surface of the beam is a mirror image of housing top surface 68, the ribs 72 fitting into the housing pockets 66 to capture the plurality of strips between the horizontal legs 68 and the beams 30. Beam bottom surface 74 contacts housing top surface 68. The beam is secured by any convenient method. In a preferred embodiment, both the beam and housing being comprised of a polymeric material, the beam and housing are secured by ultrasonic welding. However, the present invention contemplates any other form of securing the beam to the housing to capture the strips between beam 30 and horizontal legs 24 including the use of an adhesive or mechanical fastening such as latches.

The plurality of guides are not limited to the use of the pockets, which may be considered a negative guide. The guides may include positive projections extending from housing top surface 68. These guides facilitate the assembly of the strips between these projections. The projections can extend across only a part of the housing so that beams 30 can be assembled to the housing to capture strips 14 without interfering with the projections. Alternatively, the beams may include apertures to accept the projections. Again, any variety of arrangements can be used to assemble the beams 30 to the housing 12 in order to capture the strips between the beam and the horizontal leg 24, thereby securing the mechanical connection between the strips and the horizontal leg, the above examples being illustrative of some of the arrangements.

The vertical leg 23 of each contact 22 extends through housing 24, allowing the assembly to be connected to form a complete circuit by establishing a connection between the strips 14 at one end through the contact to the vertical legs 23 at the other. The vertical legs 23 extending through the housing is clearly depicted in FIG. 4. The foil array 10 assembled to a housing 12 having contacts 22 utilizing a beam 30 constitutes an assembly 38.

Foil array 10 is assembled to housing 12 as depicted in FIG. 4. Foil array 10 comprises a plurality of strips 14 that span housing 12 laterally. The strips are connected longitudinally, perpendicular to the direction that the plurality of strips 14 span the housing, by attachment to a longitudinal band 16, FIG. 1, at each end of each strip 14. Each of the strips in the plurality of strips spans the same distance about the housing 12. The longitudinal bands 16 may be attached to a ribbon (not shown) wider than a strip positioned at each end of the foil array 10 parallel to the plurality of strips. The longitudinal bands 16 and ribbons are provided to assist in handling the foil array and may be removed after assembly is completed. The foil array 10, which can be fabricated as a roll that includes a plurality of separable foil arrays, is assembled to the housing 12. After insertion of L-shaped contacts 22 into housing 12, foil array 10 is assembled across the housing 12 and guided into position by guides, either positive or negative so that the strips 14 of foil array 10 are in contact overlying horizontal leg 24 of contact 22 on opposite sides 13, 15 of housing 12, the foil array between the opposite sides 13, 15 of housing 12. Next, a pair of beams 30 is provided. The beams 30 capture the strips 14 of foil array 10 and secure the strips against the horizontal arms of contacts 22. Ideally, beams 30 are designed to matingly engage with the housing 12 so that beam bottom surface 74 contacts housing top surface 68. Thus, the housing and the beams include features that correspond to allow them to mate. Contact between not only the beams and the metallic foil, but also between the bottom surface of the beam and the top surface of the housing allows for the establishment of a reliable and secure assembly. Although beams 30 are shown individually as a separate pair, it will be understood that beams 30 can be provided as a single piece that can be assembled to housing 12.

Figure 6:
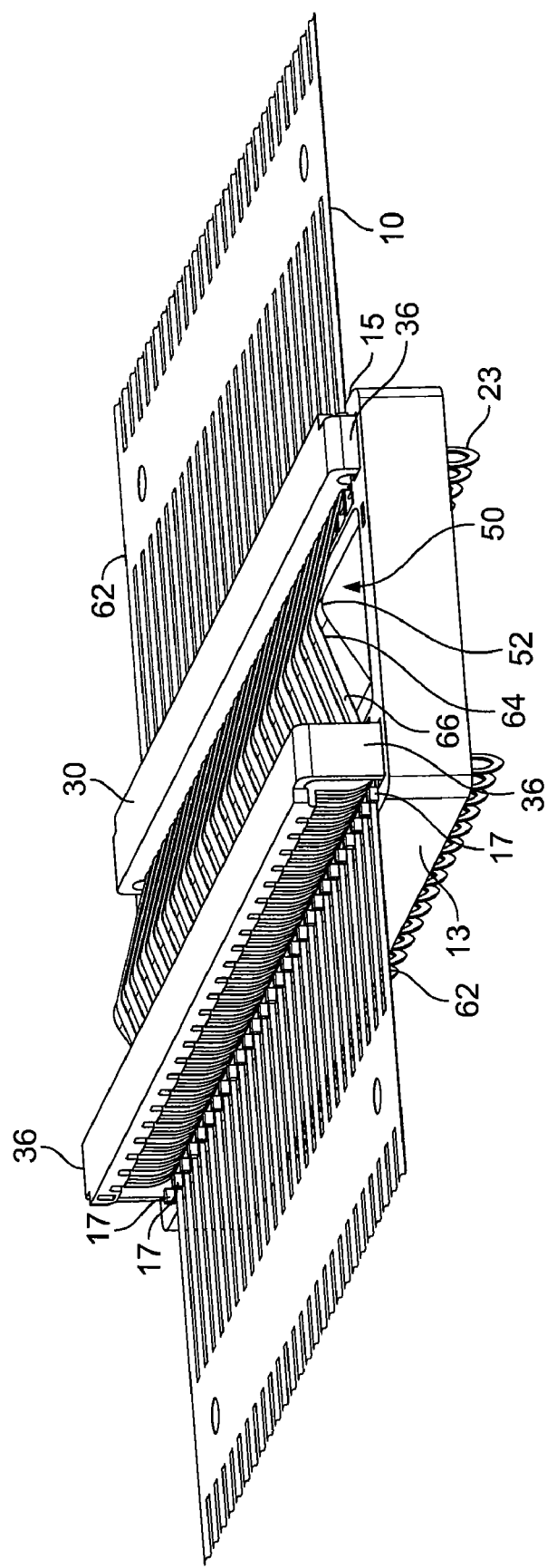
FIG. 6 is a perspective view of the foil assembly of the present invention being assembled to the housing.

A mandrel 50 is provided to support the foil array 10 during assembly. The mandrel 50 is a small surface area mandrel that contacts the plurality of strips on the underside, that is, on the side opposite of the beam top surface 34 as shown in FIG. 6. In the embodiment shown in FIG. 6, positive guides 17 project upward from housing top surface 68. The beams 30 include apertures corresponding the positive guides, the apertures in the bottom surface of beams 30 and not visible in this view. The beams 30 apply a normal force to each strip 14 of the plurality of strips securing them against the horizontal leg 24 of contact 22. Beams are secured in contact with the housing 12, by any convenient means as discussed above. If desired, the beams 30 may include a latch feature such as depicted in FIG. 6, on at least one end of each beam 30, and preferably a latch 36 at each end of the beam 30, as an alternate or additional method of securing the beam in housing 12. This can be a male latch device in the beam and a female latch receiving mechanism in the housing. In this circumstance, the housing includes at least one corresponding structure, here a latch-receiving aperture as a mating feature to correspond to the latch feature 36 of the beam 30. Any other suitable mechanism may be used to secure beams 30 to housing 12.

The mandrel 50 provides support for the foil array 10 as the beams 30 are moved downward against the foil array 10 and housing 12. After securing beams 30 against housing 12 of foil array 10 into the contacts on a first side of housing 12 using a beam 30, thereby capturing foil array 10 between horizontal legs 24 of contact 22 and beam 30 on the first side of the housing, the foil is draped over small area mandrel 50 and maintained in contact with the mandrel 50 as the free end of the foil array is identically assembled into the opposite side of the housing 12, after which mandrel 50 can be removed. On removal of the mandrel, the plurality of strips 14 are in compression, which is evident since a slight radius exists in the strips across the span between the apertures 20 in the housing 12. In a preferred embodiment, the mandrel should be sized to contact about 50% or less of each strip of the plurality of strips between apertures on either side of the housing as the assembly proceeds. Preferably, the mandrel should be sized to contact about 25% or less of each strip of the plurality of strips between apertures on either side of the housing as the assembly proceeds. Most preferably, the mandrel should be sized to contact about 10% or less of each strip of the plurality of strips between apertures on either side of the housing as the assembly proceeds. During assembly, mandrel 50 is inserted as described between the opposed sides 13, 15 of housing against the foil array until the strips spanning the mandrel are taut. Then the beams are assembled, capturing the foil strips 14 as described above. Also increasing the length of the strips will vary the resistance of the strip, thereby permitting further control of heat capacity of the strip. Thus, by carefully controlling the length of the strips and the geometry of the foil, the arc length of the assembled foil can be varied as desired.

The foil array 10 once assembled to the housing 12, as described above, is firmly captured between beams 30 and horizontal legs 24 of contacts 22, the lower legs 23 of contacts protruding through the bottom of housing 12, constitutes an assembly. With the plurality of strips 14 captured in apertures 20 on either side 13, 15 of the housing, the foil material 62 extending outwardly beyond the housing is removed by any convenient method. Preferably, a trimming tool can be used to remove the excess foil in a single operation. A circuit exists running from the lower leg 28 of contact 22 extending below housing 12. The plurality of strips form an arch 64, the strips relaxing to a compressive state on removal of the mandrel. The strips thus do not form a plane across the sides of housing 13, 15, but rather form an arch that extends slightly above a plane that would include the top surface of the housing 12. Preferably, the apex of the arch formed by each strip is a point, such that these points formed by the apex of each strip form substantially a straight line. As used herein, the term "form substantially a straight line" is governed by good manufacturing practice. The circuit runs through the contact, across strip 66 to the contact on opposed side of housing 13 to the lower leg 28. A plurality of separate circuits are thus provided. Clearly, if no strip is provided in the foil array at a position across opposed contacts on the housing, no circuit is available at this position. Alternatively, if contacts are omitted in apertures on one or both sides of the housing, again no circuit is available. Thus it is possible to tailor the final assembly to a predetermined configuration, if desired. This can be particularly useful if a circuit is not desired or required across each and every pair of apertures.

Figure 7:
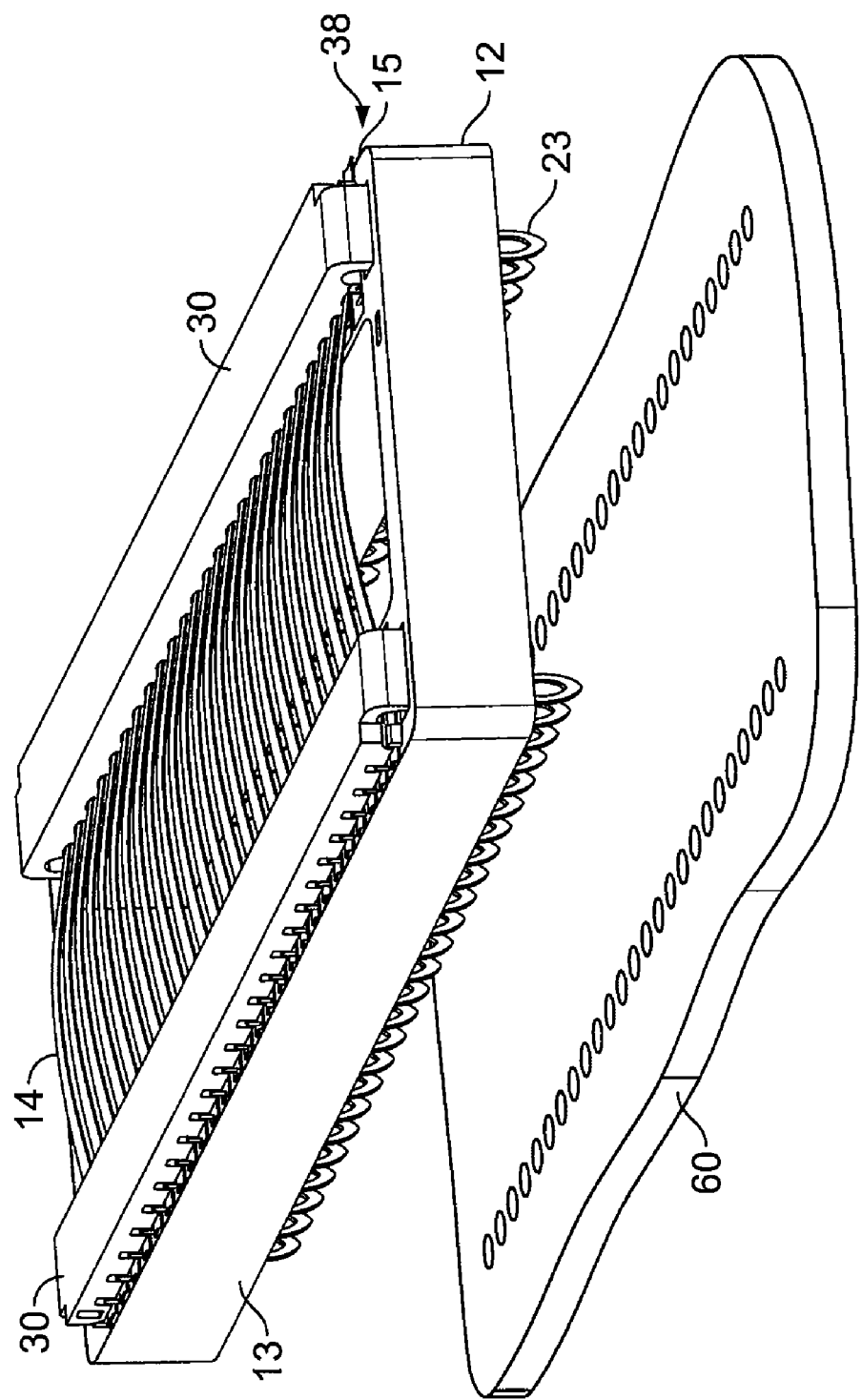
FIG. 7 is a schematic depicting the assembly being assembled to a printed circuit board.

This assembly 38 can then be connected to a power source, such as being plugged into a PCB 60 as depicted in FIG. 7, in a preferred embodiment. A controller can be provided as required, and may readily be included as part of the PCB or as a separate component. The controller can be configured and programmed to allow a flow of current across a single strip in the foil array 10, or over a plurality of strips 14 in the array 10, as desired In operation, each strip 14 in the foil array 10 is designed to allow passage of a preselected amount of current. The PCB can be designed so that the preselected current passes through each strip only once, if so desired. There are a number of uses for such a device. For example, each strip can be designed so that a strip fails if the current exceeds a predetermined level. Alternately, the PCB can be designed so that when a predetermined current level is reached, additional strips automatically can be switched in to the circuit to provide additional current to meet a demand. A material of high conductivity should be provided for this application, such as copper. The strip can also be designed so that the current passing through it results in the strip reaching a preselected temperature, at which temperature a physical event occurs, such as the melting of an applied material. The strips can be designed to provide heat, in which the material selected should have a high resistivity, allowing each strip to be a resistance heater. One such material is stainless steel, such as a high chromium stainless such as a 300 series stainless steel, and preferably a 304 stainless steel. Not only do such steels form good resistors, but also resist oxidation/corrosion at elevated temperatures. This can allow precision heating of a small space by carefully controlling the heat input into the space. Clearly, the use of the foil will dictate its design, and the design is within the skill of the artisan once the use is known. Thus, a preselected temperature or current carrying capability can be achieved by proper selection of material, strip width and strip thickness. The material selected for the foil can have a high resistivity or high conductivity, depending on the application.

For most applications, the foil thickness is about 0.0005 inches (about 12 microns) although thicknesses as thick as 0.005 inches and as low as about 0.0001 inch can be utilized. The only limitation on the minimum thickness is the ability to manufacture foil of sufficient thickness. The most cost effective method for manufacturing foil is by rolling it to the desired thickness and then slitting it into the desired array pattern. The configuration of the foil can also be achieved by chemical etching or laser cutting. Stamping of the configuration may also be possible. However, it may be possible to achieve micron or even submicron foil thicknesses by electrochemical etching or vapor deposition methods, although such methods will substantially increase the cost and require special handling precautions to prevent damage to the foil.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A thin foil metal contact assembly, comprising
   a housing having a top surface and a bottom surface, a plurality of guides, and a pair of opposed sides, each side including a plurality of apertures, the apertures on each side of the pair corresponding to apertures on the opposed side;
   a plurality of L-shaped metal contacts having a vertical leg and a horizontal leg, the vertical leg of each contact positioned in one of the apertures of the housing and extending from the housing bottom surface, the horizontal leg of each contact extending adjacent to the housing top surface;
   a metallic foil having a plurality of strips of a predetermined width and predetermined thickness of 0.005" and less extending across a pair of opposed bands, each of the strips of the metallic foil in contact with the horizontal leg of a pair of contacts, the pair of contacts on opposed sides of the housing; the foil guided into position on the horizontal legs by the guides;

a beam having a top surface and a bottom surface, a portion of the bottom surface in contact with the metallic foil to secure each strip against each contact; and wherein the beam is secured to the housing.

2. The contact assembly of claim 1 further including an ultrasonic weld securing the beam to the housing.

3. The contact assembly of claim 1 further including an adhesive securing the beam to the housing.

4. The contact assembly of claim 1 further including a fastening mechanism securing the beam to the housing.

5. The thin foil metal contact assembly of claim 1 further comprising, a pair of beams, each beam having a top surface and a bottom surface, a portion of the bottom surface in contact with the metallic foil to secure each strip against each contact, and a portion of the bottom surface in contact with the housing, each beam being on opposed sides of the housing.

6. The thin foil metal contact assembly of claim 1 wherein the metallic foil is ultra-thin, having a thickness of 0.0005" and less.

7. The thin foil metal contact assembly of claim 1 wherein the beam securing each strip of the metallic foil against each contact captures the metal foil against the horizontal leg of the contact, thereby forming a mechanical connection between the contact and the strip suitable for conduction of an electrical current therethrough.

8. The thin foil metal contact assembly of claim 4 wherein the fastening mechanism between the beam and the housing includes at least one latch in one of the housing and the beam, and at least one latch receiver, corresponding to the at least one latch, in the other of the housing and the beam.

9. The thin foil metal contact assembly of claim 8 wherein the fastening mechanism between the beam and the housing includes a male latch in the beam and a corresponding aperture in the housing.

10. The thin foil metal contact assembly of claim 1, wherein the metallic foil having a predetermined thickness is selected to accomplish a predetermined result, the foil material, width and length being selected consistent with the predetermined result.

11. The thin metal foil contact assembly of claim 1 wherein the beam bottom surface includes features corresponding to features on the housing top surface so that the beam bottom surface mates with the housing top surface to capture the metallic foil and secure each strip of the foil against the horizontal leg of each contact.

12. The thin metal foil contact assembly of claim 1 wherein the housing includes a plurality of housing pockets in the top surface, each pocket including an aperture of the plurality of apertures, and wherein each of the plurality of L-shaped contacts have the vertical leg positioned in the aperture and extending from the housing bottom surface, and wherein the horizontal leg of each contact extending adjacent to the housing top surface includes positioning the horizontal leg in the pocket to that the top surface of the contact horizontal leg is below the top surface of the housing.

13. The thin metal foil contact assembly of claim 12 wherein the beam bottom surface further includes a plurality of ribs, the ribs sized to fit into the plurality of housing pockets.

14. The thin metal foil contact assembly of claim 13 wherein the beam bottom surface abuts against the housing top surface.

15. A printed circuit board, comprising:
a board having at least one electrical circuit printed thereon;
a plurality of plugs connected to at least one printed electrical circuit;
an thin foil contact assembly assembled into the plurality of plugs, the thin foil contact assembly further comprising
a housing having a top surface and a bottom surface, a plurality of guides, and a pair of opposed sides, each side including a plurality of apertures, the apertures on each side of the pair corresponding to apertures on the opposed side;
a plurality of L-shaped metal contacts having a vertical leg and a horizontal leg, the vertical leg of each contact positioned in one of the apertures of the housing and extending from the housing bottom surface, the horizontal leg of each contact extending along the housing top surface;
a metallic foil having a plurality of strips of a predetermined width and predetermined thickness of 0.005" and less extending across a pair of opposed bands, each of the strips of the metallic foil in contact with the horizontal leg of a pair of contacts, the pair of contacts on opposed sides of the housing; the foil guided into position on the horizontal legs by the guides;
the bottom surface in contact with the metallic foil to secure each strip against each contact;
wherein the beam is secured to the housing; and
wherein the vertical leg of each of the contacts extending from the housing bottom surface are mated to plugs of the plurality of plugs, the assembly completing a circuit between the plugs.

* * * * *